US010168450B2

(12) United States Patent
Lin et al.

(10) Patent No.: US 10,168,450 B2
(45) Date of Patent: Jan. 1, 2019

(54) SILICON WAFER HAVING COLORED TOP SIDE

(71) Applicant: SunASIC Technologies, Inc., New Taipei (TW)

(72) Inventors: Chi-Chou Lin, New Taipei (TW); Zheng-Ping He, New Taipei (TW)

(73) Assignee: Sunasic Technologies, Inc., New Taipei (TW)

( * ) Notice: Subject to any disclaimer, the term of this patent is extended or adjusted under 35 U.S.C. 154(b) by 101 days.

(21) Appl. No.: 14/141,717

(22) Filed: Dec. 27, 2013

(65) Prior Publication Data

US 2015/0185378 A1 Jul. 2, 2015

(51) Int. Cl.
*H01L 23/544* (2006.01)
*H01L 21/76* (2006.01)
*G02B 1/00* (2006.01)
*G02B 5/18* (2006.01)
*G02B 5/20* (2006.01)

(52) U.S. Cl.
CPC ........... *G02B 1/005* (2013.01); *G02B 5/1842* (2013.01); *G02B 5/203* (2013.01); *H01L 2933/0083* (2013.01)

(58) Field of Classification Search
CPC ........ B82Y 20/00; G02B 5/18; G02B 5/1866; G02B 5/3083; H01L 23/544
USPC ............. 359/576; 427/162; 216/24; 438/479
See application file for complete search history.

(56) References Cited

U.S. PATENT DOCUMENTS

| | | | | | |
|---|---|---|---|---|---|
| 4,631,416 | A | * | 12/1986 | Trutna, Jr. | G03F 9/7049 250/237 G |
| 7,722,194 | B2 | * | 5/2010 | Amako | G02B 5/1842 349/114 |
| 7,944,063 | B2 | * | 5/2011 | Van Haren | G03F 9/7076 257/797 |
| 8,619,215 | B2 | * | 12/2013 | Kumai | B82Y 20/00 349/96 |
| 8,765,360 | B2 | * | 7/2014 | Wang | B82Y 20/00 359/494.01 |
| 8,873,144 | B2 | * | 10/2014 | Davis | G02B 5/3058 359/485.05 |
| 9,395,635 | B2 | * | 7/2016 | De Boer | G03F 9/7076 |
| 2003/0021466 | A1 | * | 1/2003 | Adel | G03F 7/70633 382/151 |

(Continued)

*Primary Examiner* — Joseph C Nicely
*Assistant Examiner* — David Goodwin
(74) *Attorney, Agent, or Firm* — Che-Yang Chen; Law Offices of Scott Warmuth

(57) ABSTRACT

A silicon wafer having colored top side is disclosed in the present invention. The silicon wafer includes: a wafer; a first semi-conductor layer, formed on at least a portion of a top side of the wafer, having periodical structures to form a grating pattern, and a second semi-conductor layer, formed on the first semi-conductor layer with a bottom side substantially fully contacted with the periodical structures. The first semi-conductor layer and the second semi-conductor layer form a photonic crystal layer and work to reflect a predetermined wavelength range of incident visible light beams. The present invention provides a silicon wafer which can reflect specified color(s) from the surface facing external light beams. Therefore, dies from cutting the silicon wafer with functions to interact with external environment rather than packaged can have advantages to show some specified logo or trademark.

18 Claims, 12 Drawing Sheets

(56) References Cited

U.S. PATENT DOCUMENTS

| | | | | |
|---|---|---|---|---|
| 2004/0008416 A1* | 1/2004 | Okuno | ............... | G02B 5/1809 |
| | | | | 359/566 |
| 2004/0075179 A1* | 4/2004 | Liu | ............... | G03F 9/7076 |
| | | | | 257/797 |
| 2005/0277063 A1* | 12/2005 | Wang | ............... | G02B 5/1857 |
| | | | | 430/311 |
| 2006/0127830 A1* | 6/2006 | Deng | ............... | G02B 5/3083 |
| | | | | 431/188 |
| 2007/0114678 A1* | 5/2007 | Van Haren | ............... | G03F 9/7049 |
| | | | | 257/797 |
| 2007/0132996 A1* | 6/2007 | Van Haren | ............... | G03F 9/7076 |
| | | | | 356/401 |
| 2009/0323014 A1* | 12/2009 | Cunningham | ............... | G02B 5/28 |
| | | | | 351/44 |
| 2010/0207284 A1* | 8/2010 | Holloway | ............... | H01L 21/67294 |
| | | | | 257/797 |
| 2011/0279900 A1* | 11/2011 | Wang | ............... | B82Y 20/00 |
| | | | | 359/576 |
| 2014/0286367 A1* | 9/2014 | Scofield | ............... | H01S 5/1042 |
| | | | | 372/43.01 |

\* cited by examiner

SILICON WAFER HAVING COLORED TOP SIDE

FIELD OF THE INVENTION

The present invention relates to a silicon wafer. More particularly, the present invention relates to a silicon wafer which has a colored top side to reflect specified light beams.

BACKGROUND OF THE INVENTION

Photonic crystals are periodical optical nanostructures that affect motion of photons in much the same way that ionic lattices affect electrons in solids. It was provided by E. Yablonovutch and S. John in 1987. For electromagnetic waves, energy band structures exist in a 3D-medium with periodically arranged dielectric constants. It is so-called photonic band gap system. In such structures, since the electromagnetic waves scatter in the periodical medium, some wave bands of the electromagnetic waves decrease exponentially due to destructive interference and can not transmit. Therefore, energy gap forms over the spectrum. Characteristics of propagation of the electromagnetic waves in the photonic crystals, including amplitude, phase, polarization direction and wavelength, can be significantly modulized by controlling characteristics of the photonic crystals, such as emitting spectrum, group velocity dispersion, polarization features, phase matching, etc.

Photonic crystals occur in nature in the form of structural coloration and are useful in different forms in a range of applications, for example, color changing paints and inks, photonic crystal fibers, optical fibers and optical computers. Because, photonic crystals are new optical materials for controlling and manipulating the flow of light, many recent inventions applied photonic crystal structures in light emitting diodes to enhance light extraction efficiency.

Please refer to FIG. 1. U.S. Pat. No. 8,288,755 disclosed a light emitting element with photonic crystal structure inside. The light emitting element has a substrate 100 to form all elements of the light emitting element on and pass light beams. A buffer layer 108 is formed on (Manufacturing processes are up side down. FIG. 1 only shows when the light emitting element works.) the substrate 100. Then, form photonic crystal patterns 106 and a pad pattern 107 in the same process. A light-emitting structure 110 is formed upon the photonic crystal patterns 106 and includes a first conductive layer 112, a light emitting layer 114 and a second conductive layer 116. An insulating layer 120 is formed on the upper surface and sidewalls of the light-emitting structure 110. A first ohmic layer 131 and a second ohmic layer 132 are created to fill openings formed by the insulating layer 120. Finally, a first electrode 140 and a second electrode 150 are produced to connect to external power. Therefore, when a bias (−) and bias (+) are applied to the first electrode 140 and the second electrode 150, respectively, light beams L are generated to emit upward, through the photonic crystal patterns 106. At this moment, the photonic crystal patterns 106 help more light beams out of the first conductive layer 112, i.e., increase light extraction efficiency.

The aforementioned invention utilizes the feature of photonic crystal which allows a specified band of light beams to pass through to enhance light extraction efficiency. Photonic crystal patterns are formed during the processes of a wafer. This is an application of photonic crystal structures with a wafer (or wafer level device). Since photonic crystals also have a characteristic to reflect specified light beams, if well arranged, the light beams can be reflected to show a specified color, even a specified logo. For some integrated circuits which have an open area to operate, for example sensing portion of a fingerprint reader, the reflected light be can indicate a direction to slide fingers or provide a trade mark for commercial use over the area. The present invention focuses a structure which fulfills the above goal.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

The present provides a silicon wafer which can reflect specified color(s) from the surface facing external light beams. Therefore, dies from cutting the silicon wafer with functions to interact with external environment rather than packaged can have advantage to show some specified logo or trademark.

Therefore, in accordance with an aspect of the present invention, a silicon wafer having colored top side includes: a wafer; a first semi-conductor layer, formed on at least a portion of a top side of the wafer, having periodical structures to form a grating pattern, and a second semi-conductor layer, formed on the first semi-conductor layer with a bottom side substantially fully contacted with the periodical structures. The first semi-conductor layer and the second semi-conductor layer form a photonic crystal layer and work to reflect a predetermined wavelength range of incident visible light beams so that at least two different colors can be provided from the top of the wafer.

Preferably, a center distance between adjacent periodical structures ranges from 100 nm to 700 nm.

Preferably, a boundary of the periodical structures forms a specified logo.

Preferably, the first semi-conductor layer or the second semi-conductor layer is made of indium tin oxide (ITO), zinc oxide (ZnO), titanium nitride (TiN), titanium (Ti), silver (Ag), aluminum (Al), rhodium (Rh), palladium (Pd), alloy of nickel and aurum (Ni—Au), alloy of titanium and platinum (Ti—Pt), or a mixture thereof.

Preferably, the first semi-conductor layer or the second semi-conductor layer is made of silicon (Si), silicon nitride (SiN), silicon dioxide (SiO2), polyimide (PI), silicon carbide (SiC), and silicon oxynitride (SiON).

Preferably, the silicon wafer having colored top side further includes a third semi-conductor layer and a fourth semi-conductor layer, formed from bottom to top in sequence, above at least a portion of the second semi-conductor layer, a portion of the wafer, or a portion of the second semi-conductor layer and the wafer, wherein the third semi-conductor layer and the fourth semi-conductor layer form a photonic crystal layer.

Preferably, the third semi-conductor layer has periodical structures and a bottom side of the fourth semi-conductor layer substantially fully contacts the periodical structures.

Preferably, the silicon wafer having colored top side further includes a protection layer, covering top portion of the second semi-conductor layer, for providing protection to the second semi-conductor layer.

Preferably, the protection layer is transparent or translucent to pass light beams.

Preferably, the periodical structures are columns, air holes, stacked rods or stacked nano-structures.

DETAILED DESCRIPTION OF THE PREFERRED EMBODIMENTS

The present invention will now be described more specifically with reference to the following embodiments.

First Embodiment

Figure 1:
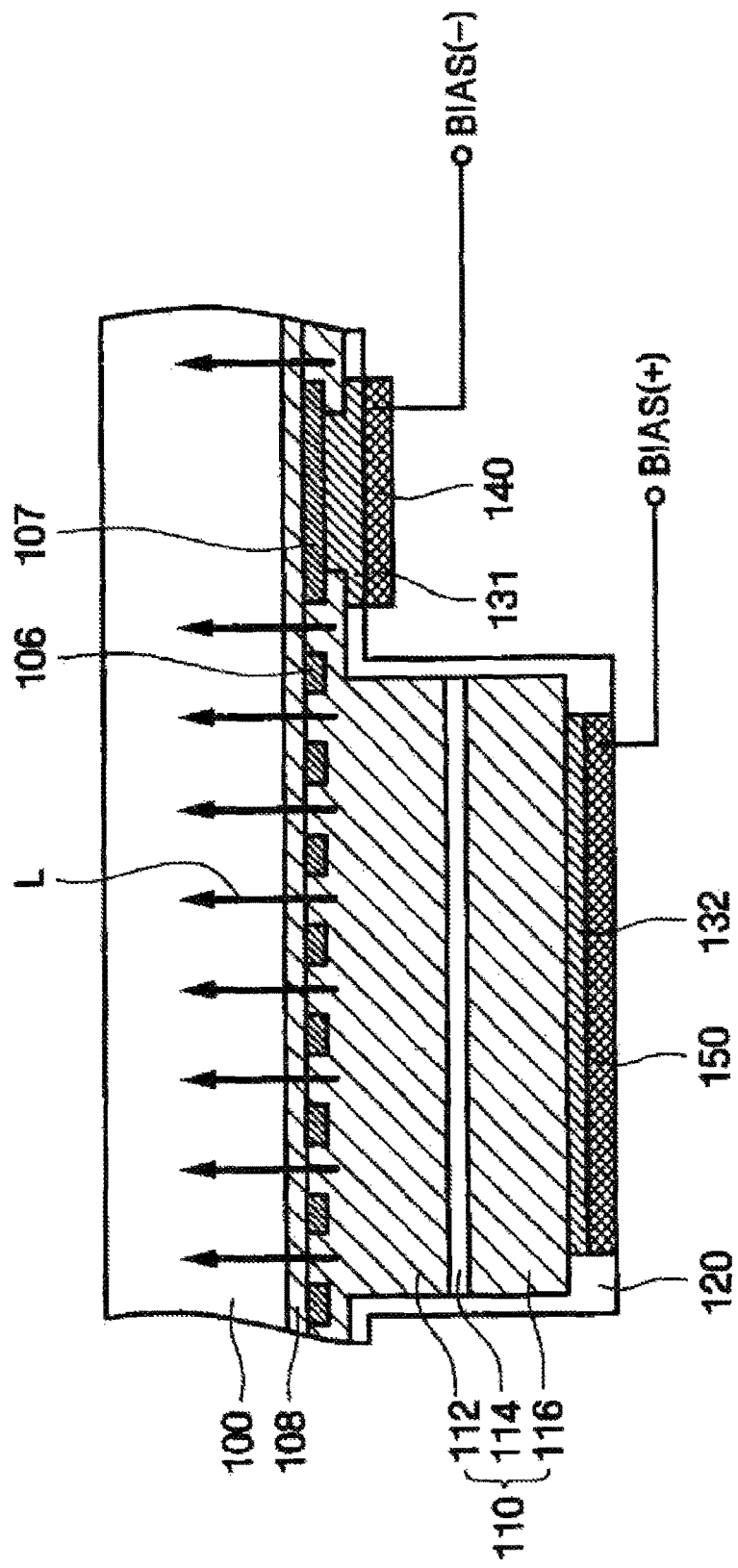
FIG. 1 is a prior art of a light emitting diode which has photonic crystal structures to enhance light extraction efficiency.
Figure 2:
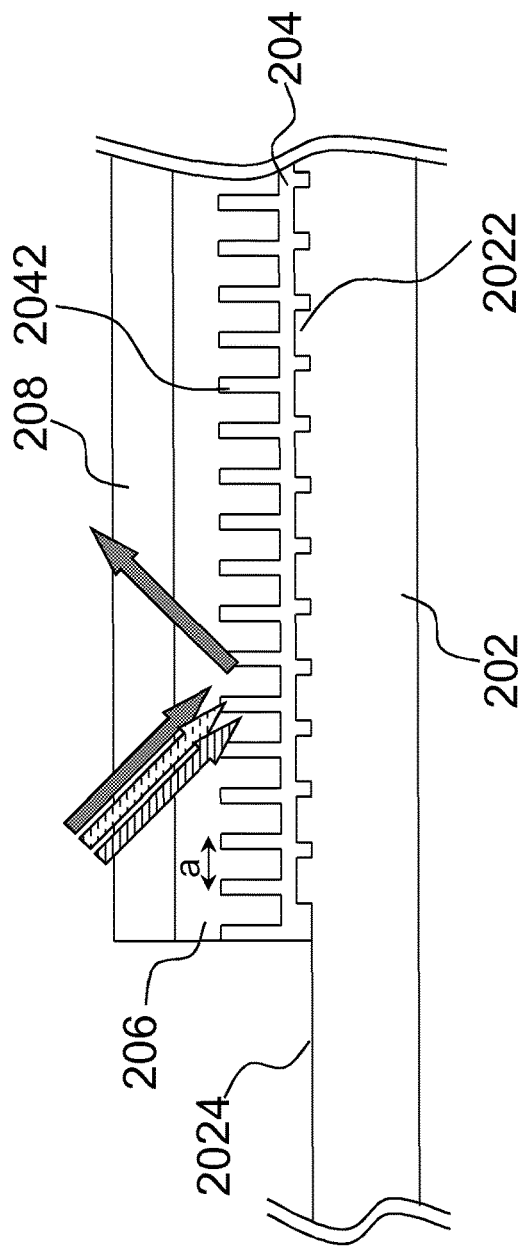
FIG. 2 illustrates a cross-section a portion of a colored silicon wafer which has a colored top side in a first embodiment according to the present invention.

Please refer to FIG. 2 to FIG. 5. A first embodiment of the present invention is disclosed. A portion of a cross-section of a colored silicon wafer 20 which has a colored top side is shown in FIG. 2. The colored silicon wafer 20 includes a base silicon wafer 202, a first semi-conductor layer 204, a second semi-conductor layer 206 and a protection layer 208, formed one upon another in sequence. The first semi-conductor layer 204 and the second semi-conductor layer 206 form a photonic crystal layer. For illustration purpose, the vertical proportion is not to scale (height of the base silicon wafer 202 is much shorter than it is).

The base silicon wafer 202 can be cut to produce many dies for specified functions. According to the present invention, at least one side of the dies will face external light, rather than both sides are packaged in thermosetting plastics. In this embodiment, the dies cut from the base silicon wafer 202 can be further processed to be fingerprint reader sensors. As to the art of manufacturing fingerprint reader sensors, there are numbers of sensing elements for detecting change of capacitance. Therefore, periodical protrusions 2022 are formed on the top surface of a die, partial area of the base silicon wafer 202. Upon the protrusions 2022, it is the first semi-conductor layer 204. A plane portion 2024 of the base silicon wafer 202 which is not covered by the first semi-conductor layer 204 and the second semi-conductor layer 206 is reserved for die cutting.

Figure 3:
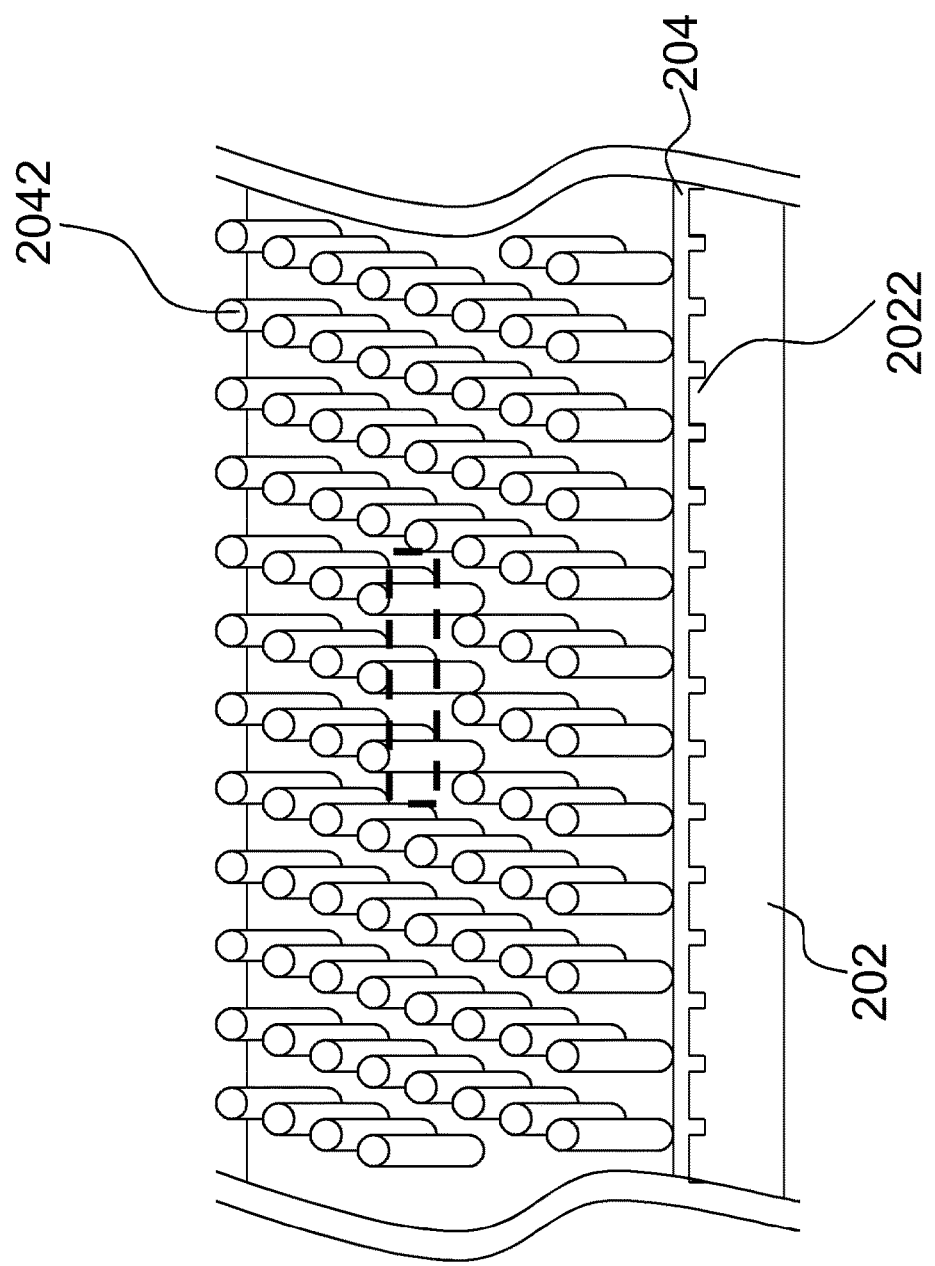
FIG. 3 is a perspective view of a portion of a base silicon wafer and a first semi-conductor layer in the first embodiment.

According to FIG. 2, the first semi-conductor layer 204 is also formed on a portion of a top side of the base silicon wafer 202. The first semi-conductor layer 204 has periodical structures 2042 which form a grating pattern. In order to have a better understanding, please see FIG. 2 and FIG. 3 at the same time. FIG. 3 is a perspective view of a portion of the base silicon wafer 202 and the first semi-conductor layer 204. It should be noticed that FIG. 3 may be cut from any portion of the base silicon wafer 202. Hence, any number of the periodical structures 2042 and arrangement are possible to be shown in any perspective view, not restricted to FIG. 3 only. The first semi-conductor layer 204 is made of aluminum (Al) and formed by sputtering and etching processes.

Figure 4:
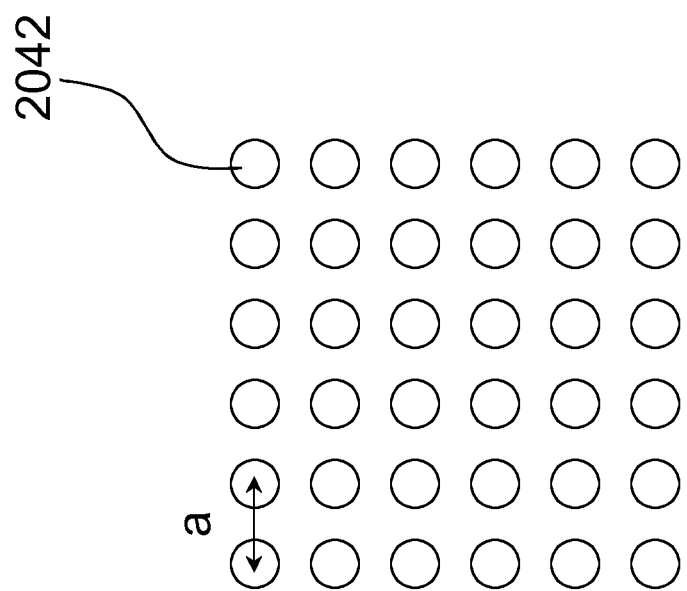
FIG. 4 is a partial top view of periodical structures in the first embodiment.
Figure 5:
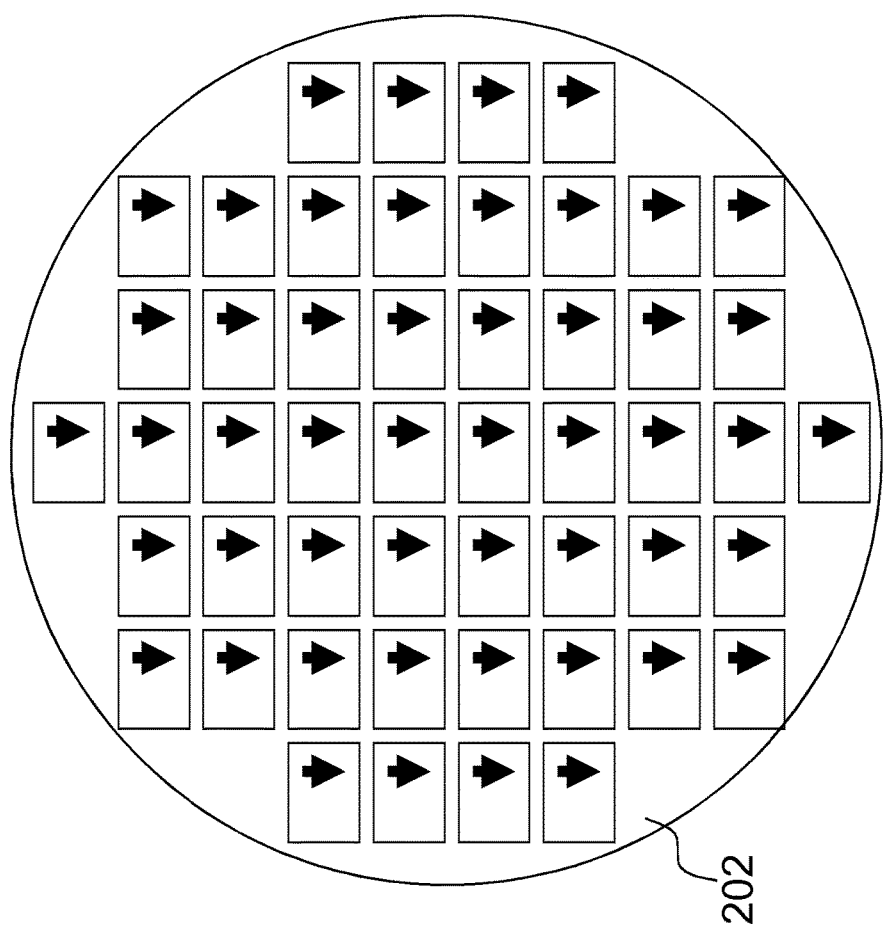
FIG. 5 illustrates a top view of the colored silicon wafer in the first embodiment.

FIG. 4 is a partial top view of the periodical structures 2042. The periodical structures 2042 are arranged in a square matrix. Distance between centers of adjacent periodical structures 2042 is shown by letter "a". For an arrangement of microcosmic structures acting as photonic crystals, "a" is a quarter of wavelength of some visible light beams. Therefore, "a" ranges from 100 nm to 700 nm. It is 150 nm in the present embodiment.

The second semi-conductor layer 206 is made of indium tin oxide (ITO) and formed on the first semi-conductor layer 204. It should be emphasized that rigidness of the first semi-conductor layer 204 is greater than that of the second semi-conductor layer 206 to hold the photonic crystal structure. Bottom side of the second semi-conductor layer 206 is substantially fully contacted with the periodical structures 2042 of the first semi-conductor layer 204. That is to say that the ITO fills in all the spaces among the periodical structures 2042 so that the second semi-conductor layer 206 integrates with the first semi-conductor layer 204. The first semi-conductor layer 204 and the second semi-conductor layer 206 therefore work to reflect a predetermined wavelength range of incident visible light beams. Since the reflected light beams from the first semi-conductor layer 204 and the second semi-conductor layer 206 are different from those reflected from where the first semi-conductor layer 204 and the second semi-conductor layer 206 don't cover so that at least two different colors can be provided from the top of the wafer.

In order to have a better illustration, please see FIG. 2 again. Light beams having different wavelengths are shown by three arrows (different filling effects, dots, dashed lines and solid lines). Only the arrow with dots can be reflected from the top surface of the second semi-conductor layer 206. It is the reason why the colored silicon wafer 20 can provide any designed color. Also, a design of defects (removing some periodical structures 2042, marked in dashed frame in FIG. 3) may help reflect light beams in a specified angle of reflection. It makes viewer to see the color at that angle. Meanwhile, boundary of the periodical structures 2042 forms a specified logo. Please refer to FIG. 5. An arrow shows a direction for finger to slide over can be presented by color reflected light but has no effect on the sensing elements below.

The protection layer 208 covers top portion of the second semi-conductor layer 206. It is used to provide protection to the second semi-conductor layer 206. The protection layer 208 should be rigid. It can use transparent or translucent materials. In this embodiment, the protection layer 208 is a layer of diamond film. In fact, a layer of ceramic can be use, too. According to the spirit of the present invention, the protection layer 208 might not be necessary as long as the second semi-conductor layer 206 is rigid enough to resist friction caused by fingers.

It should be noticed that the first semi-conductor layer 204 is not limited to be made of Al and the second semi-conductor layer 206 is not limited to be made of ITO. In practice, the first semi-conductor layer 204 can use material like ITO, zinc oxide (ZnO), titanium nitride (TiN), titanium (Ti), silver (Ag), rhodium (Rh), palladium (Pd), alloy of nickel and aurum (Ni—Au), alloy of titanium and platinum (Ti—Pt), or a mixture of the above metals and alloy. It can also be made of nonmetallic materials or compounds, such as silicon (Si), silicon nitride (SiN), silicon dioxide ($SiO_2$), polyimide (PI), silicon carbide (SiC), and silicon oxynitride (SiON). Similarly, the second semi-conductor layer 206 can be formed by Al, ZnO, TiN, Ti, Ag, Rh, Pd, Ni—Au alloy, Ti—Pt alloy or a mixture of the mentioned metals and alloy. Si, SiN, $SiO_2$, PI, SiC, and SiON can be used as well.

The periodical structures 2042 used in the present embodiment are columns. It is a two-dimensional photonic crystal structure. Other structures, such as air holes, can be used (will be illustrated in a second embodiment). Even three-dimensional photonic crystal structures, for example, stacked rods or stacked nano-structures, can be applied.

Second Embodiment

Figure 6:
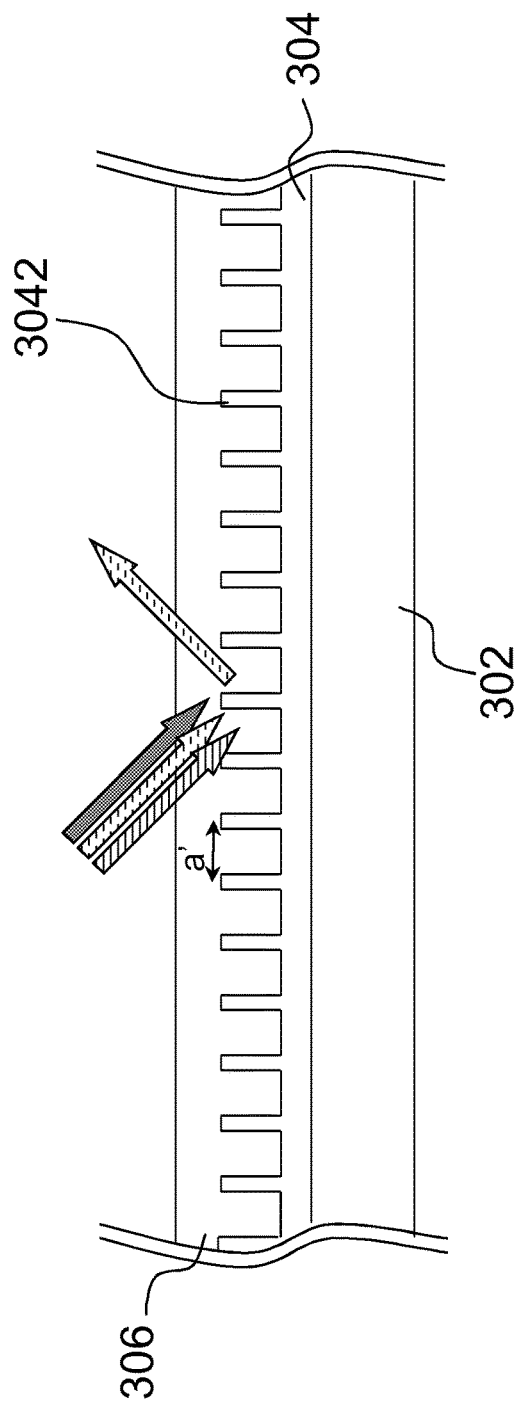
FIG. 6 illustrates a cross-section a portion of a colored silicon wafer which has a colored top side in a second embodiment according to the present invention.

Please refer to FIG. 6 to FIG. 9. The first embodiment of the present invention is disclosed. A portion of a cross-section of a colored silicon wafer 30 which has a colored top side is shown in FIG. 6. The colored silicon wafer 30 includes a base silicon wafer 302, a first semi-conductor layer 304 and a second semi-conductor layer 306. Similarly, the first semi-conductor layer 304 and the second semi-conductor layer 306 form a photonic crystal layer. Unlike the first embodiment, there is no protection layer. Similarly, for illustration purpose, the vertical proportion is not to scale (height of the base silicon wafer 302 is much shorter than it is).

The base silicon wafer 302 can be cut to produce many dies for specified functions. In this embodiment, the dies cut from the base silicon wafer 302 and processed are not limited to fingerprint reader sensor. Any die has at least one side of the dies facing external light, rather than both sides are packaged in thermosetting plastics can be applied. As shown in FIG. 6, top of the base silicon wafer 302 is flat. This is because the base silicon wafer 302 has a protection layer (not shown) on the top and connected with the first semi-conductor layer 304.

Figure 7:
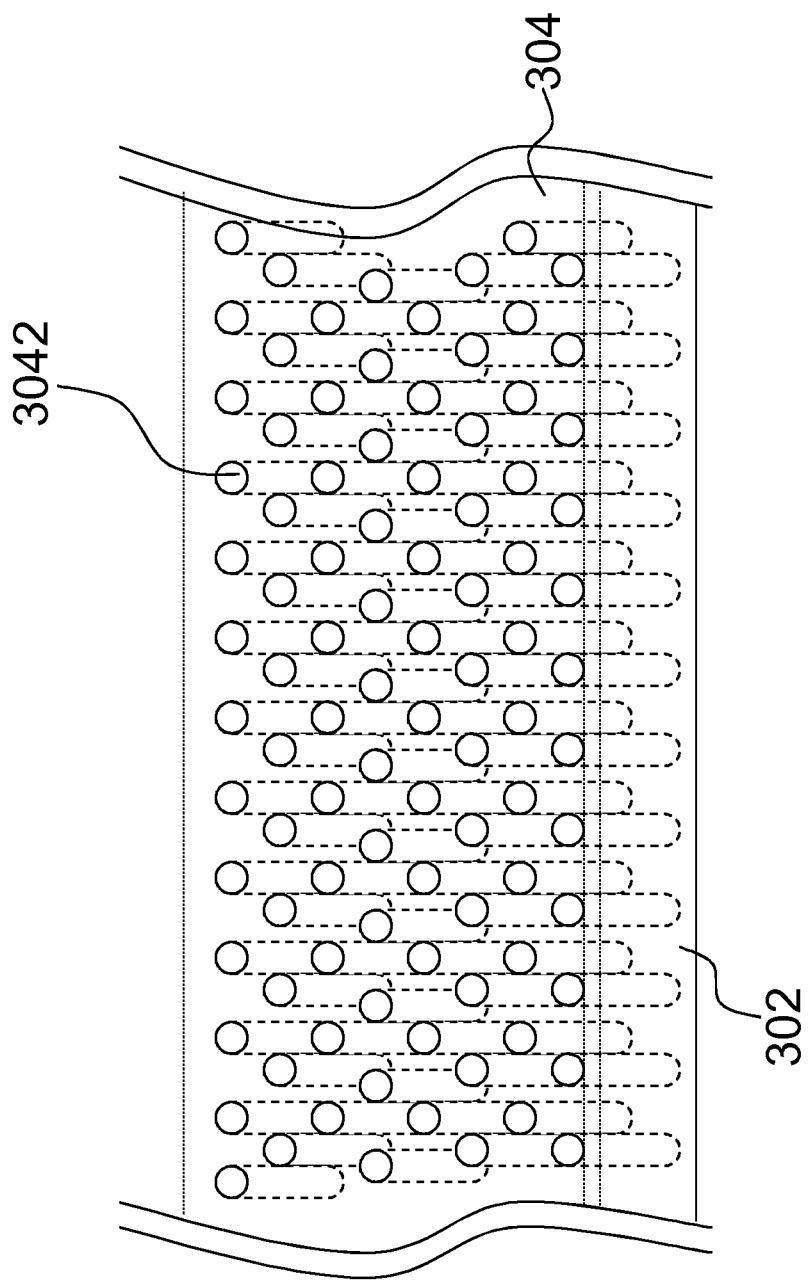
FIG. 7 is a perspective view of a portion of a base silicon wafer and a first semi-conductor layer in the second embodiment.

The first semi-conductor layer 304 is formed on a portion of a top side of the base silicon wafer 302. The first semi-conductor layer 304 has periodical structures 3042 which form a grating pattern. In order to have a better understanding, please see FIG. 6 and FIG. 7 at the same time. FIG. 7 is a perspective view of a portion of the base silicon wafer 302 and the first semi-conductor layer 304. It should be noticed that FIG. 7 may be cut from any portion of the base silicon wafer 302. Hence, any number of the periodical structures 3042 and arrangement are possible to be shown in any perspective view, not restricted to FIG. 7 only. Not like the first embodiment, the periodical structures 3042 are air holes. According to the present embodiment, the first semi-conductor layer 304 is made of Ni—Au alloy and formed by sputtering and etching processes.

Figure 8:
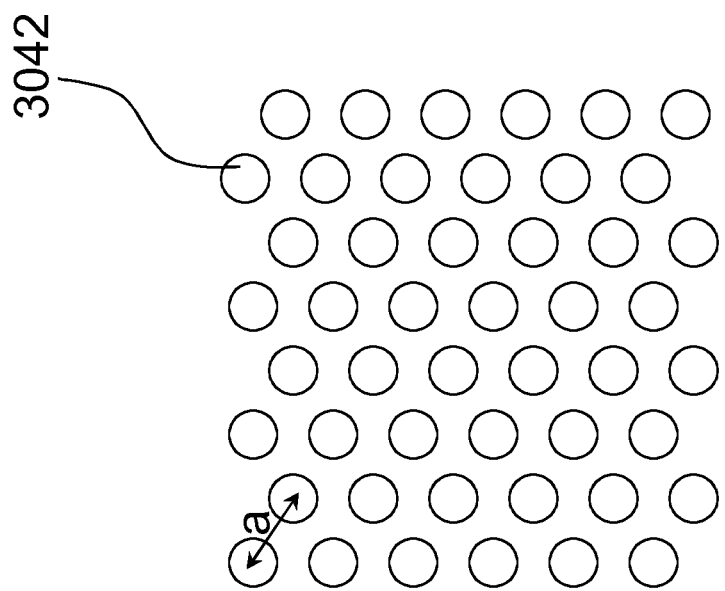
FIG. 8 is a partial top view of periodical structures in the second embodiment.
Figure 9:
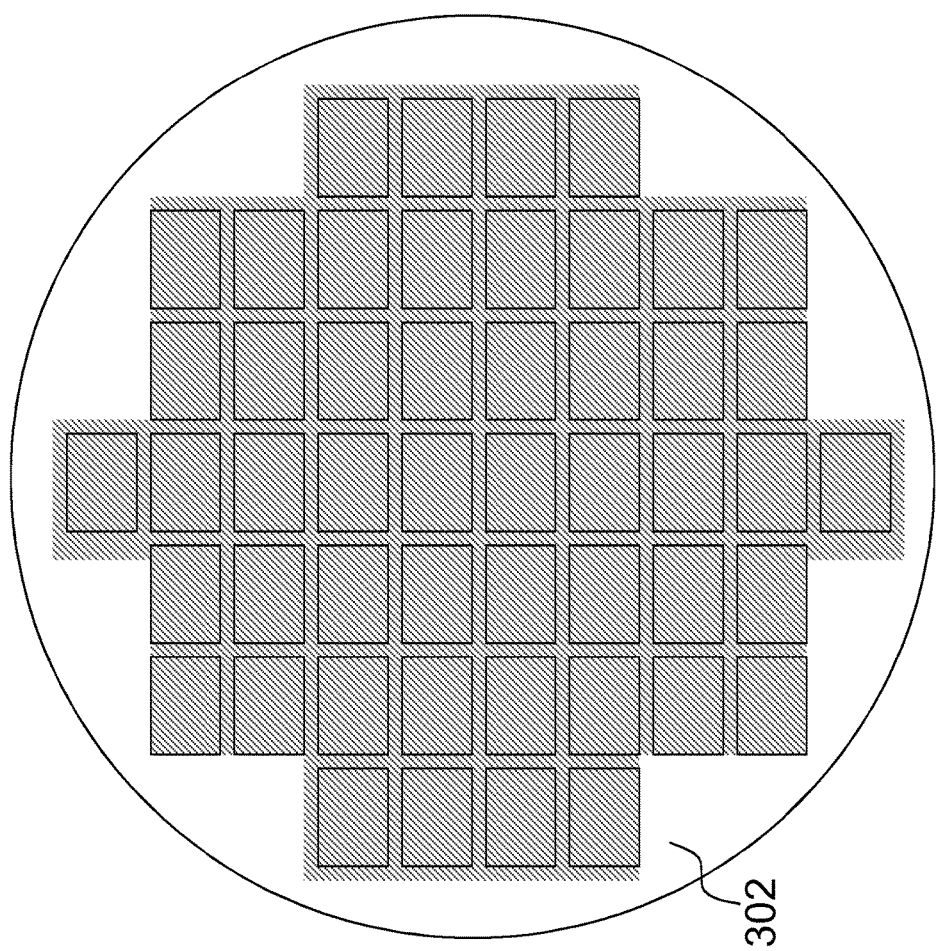
FIG. 9 illustrates a top view of the colored silicon wafer in the second embodiment.

FIG. 8 is a partial top view of the periodical structures 3042. The periodical structures 3042 are arranged like a honeycomb. Distance between centers of adjacent periodical structures 3042 is shown by letter "a". Similarly, "a" is a quarter of wavelength of some visible light beams. "a'" is 170 nm in the present embodiment.

The second semi-conductor layer 306 is made of ZnO and formed on the first semi-conductor layer 304. It should be emphasized that rigidness of the first semi-conductor layer 304 is greater than that of the second semi-conductor layer 306 to hold the photonic crystal structure. Bottom side of the second semi-conductor layer 306 is substantially fully contacted with the periodical structures 3042 of the first semi-conductor layer 304. That is to say that the ZnO fills in all air holes of the periodical structures 3042 so that the second semi-conductor layer 306 integrates with the first semi-conductor layer 304. The first semi-conductor layer 304 and the second semi-conductor layer 306 therefore work to reflect a predetermined wavelength range of incident visible light beams. In order to have a better illustration, please see FIG. 6 again. Light beams having different wavelengths are shown by three arrows (different filling effects, dots, dashed lines and solid lines). Only the arrow with dashed lines can be reflected from the top surface of the second semi-conductor layer 306. Since the photonic crystal structures (the first semi-conductor layer 304 and the second semi-conductor layer 306) covers top surfaces of all die portions of the colored silicon wafer 30, a specified color can be reflected from the top of the dies (Please refer to FIG. 9).

Third Embodiment

Figure 10:
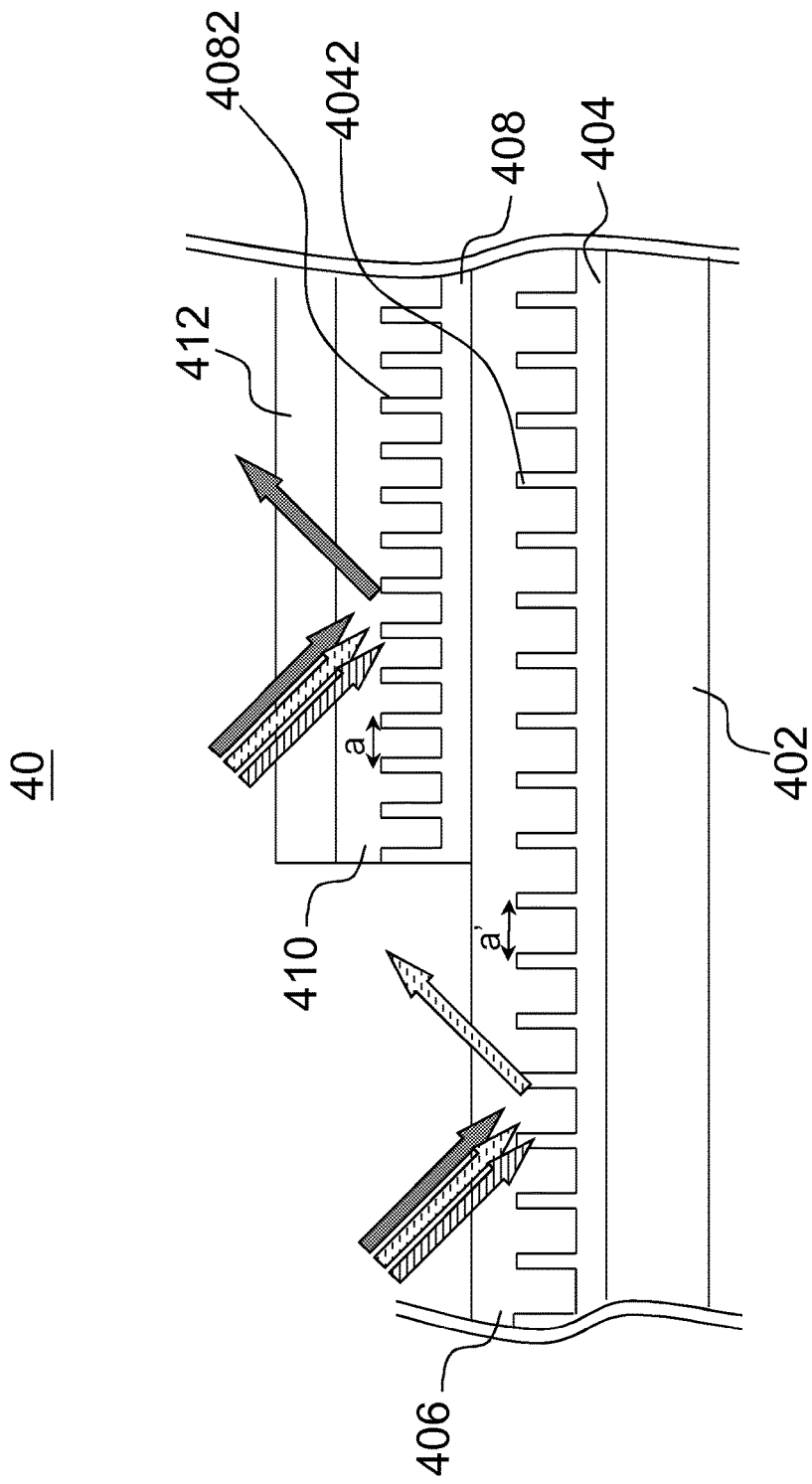
FIG. 10 illustrates a cross-section a portion of a colored silicon wafer which has a colored top side in a third embodiment according to the present invention.
Figure 11:
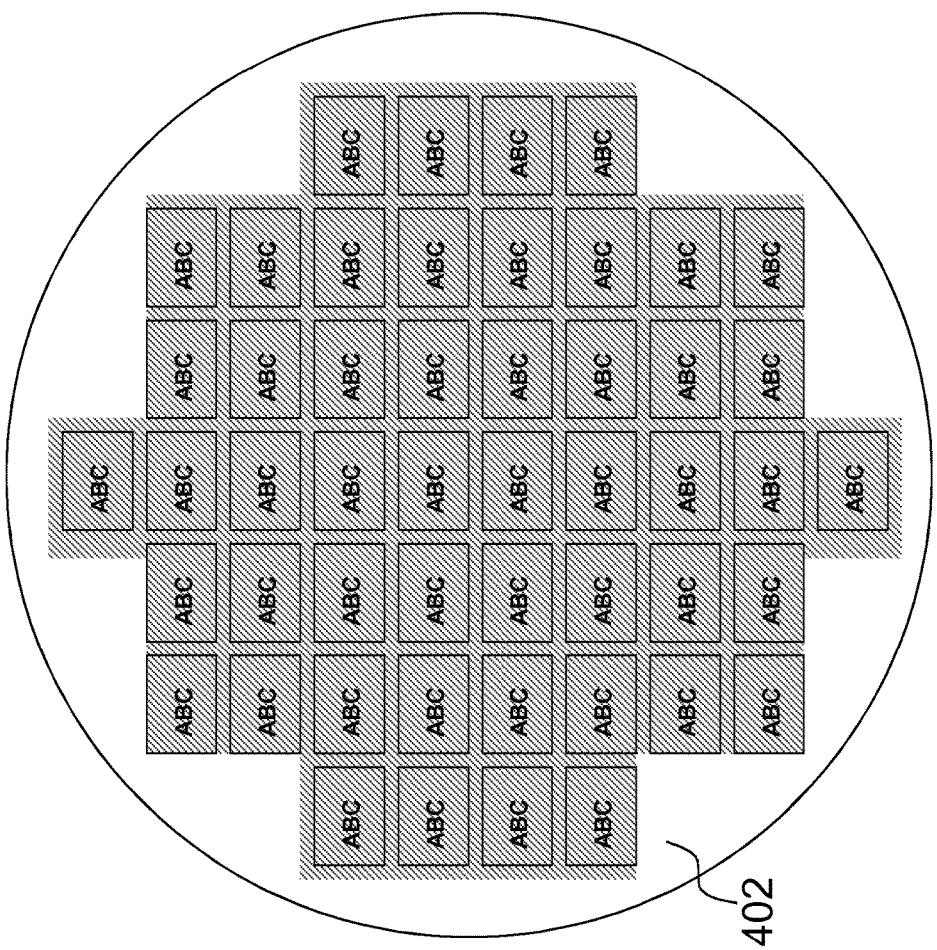
FIG. 11 illustrates a top view of the colored silicon wafer in the third embodiment.

Please refer to FIG. 10 and FIG. 11. A third embodiment of the present invention is disclosed. A portion of a cross-section of a colored silicon wafer 40 which has a colored top side is shown in FIG. 10. The colored silicon wafer 40 includes a base silicon wafer 402, a first semi-conductor layer 404, a second semi-conductor layer 406, a third semi-conductor layer 408, a fourth semi-conductor layer 410 and a protection layer 412, formed one upon another in sequence. Similarly, the first semi-conductor layer 404 and the second semi-conductor layer 406 form a photonic crystal layer. The third semi-conductor layer 408 and the fourth semi-conductor layer 410 also form a photonic crystal layer. For illustration purpose, the vertical proportion is not to scale (height of the base silicon wafer 402 is much shorter than it is).

The base silicon wafer 402 works as the base silicon wafer 302 in the second embodiment and will not be mentioned in details.

The first semi-conductor layer 404 is formed on a portion of a top side of the base silicon wafer 402. The first semi-conductor layer 404 has periodical structures 4042 which form a grating pattern. The first semi-conductor layer 404 is made of Ni—Au alloy and formed by sputtering and etching processes. The periodical structures 4042 are arranged like a honeycomb and in the form of air holes. The second semi-conductor layer 406 is made of ZnO and formed on the first semi-conductor layer 404. Bottom side of the second semi-conductor layer 406 is substantially fully contacted with the periodical structures 4042 of the first semi-conductor layer 404. That is to say that the ZnO fills in all air holes of the periodical structures 4042 so that the second semi-conductor layer 406 integrates with the first semi-conductor layer 404. The first semi-conductor layer 404 and the second semi-conductor layer 406 therefore work to reflect a predetermined wavelength range of incident visible light beams. Light beams having different wavelengths are shown by three arrows (different filling effects, dots, dashed lines and solid lines). Only the arrow with dashed lines can be reflected from the top surface of the second semi-conductor layer 406.

Unlike the first and second embodiments, the third embodiment employed the third semi-conductor layer 408 and the fourth semi-conductor layer 410.

The third semi-conductor layer 408 is formed on a portion of a top side of the second semi-conductor layer 406. The third semi-conductor layer 408 has periodical structures 4082 which form a grating pattern. The third semi-conductor layer 408 is made of Al and formed by sputtering and etching processes. The periodical structures 4082 are arranged like in a square matrix and in the form of columns. The fourth semi-conductor layer 410 is made of ITO and formed on the third semi-conductor layer 408. Bottom side of the fourth semi-conductor layer 410 is substantially fully contacted with the periodical structures 4082 of the third semi-conductor layer 408. That is to say that the ITO fills in all the spaces among the periodical structures 4082 so that the fourth semi-conductor layer 410 integrates with the third semi-conductor layer 408. The third semi-conductor layer 408 and the fourth semi-conductor layer 410 therefore work to reflect a predetermined wavelength range of incident visible light beams. Light beams having different wavelengths are shown by three arrows (different filling effects, dots, dashed lines and solid lines). Only the arrow with dots can be reflected from the top surface of the fourth semi-conductor layer 410. In this embodiment, the third semi-conductor layer 408 covers a portion of the second semi-conductor layer 406. It creates a color by reflecting specified light beams color. The third semi-conductor layer 408 can cover a portion of the base silicon wafer 402, or a portion of the second semi-conductor layer 406 and the base silicon wafer 402 design on different design of appearance.

The protection layer 412 covers top portion of the fourth semi-conductor layer 406. It is used to provide protection to the fourth semi-conductor layer 406.

By working of the four semi-conductor layer s, a base color is shown on the dies and boundary of the periodical structures 2082 forms a trademark with another color enclosed. Please refer to FIG. 11. ABC may be a trademark of a company or product and no effect will influences functions of the dies beneath.

Distance between centers of adjacent periodical structures 4042 is shown by letter "a". Distance between centers of adjacent periodical structures 4082 is shown by letter "a'". "a" and "a'" are not the same. Here, "a" is 170 nm and "a'" is 150 nm.

Fourth Embodiment

Figure 12:
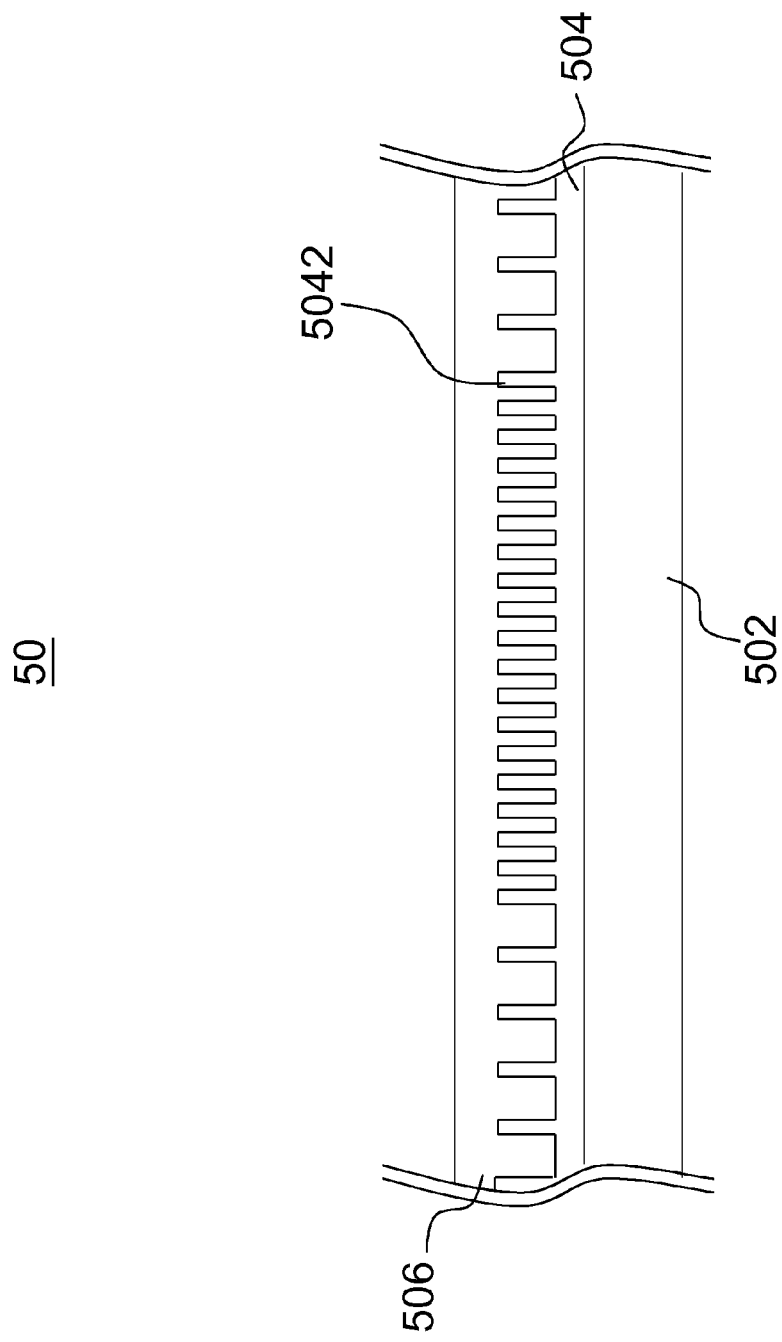
FIG. 12 illustrates a cross-section a portion of a colored silicon wafer which has a colored top side in a fourth embodiment according to the present invention.

Please refer to FIG. 12. A fourth embodiment of the present invention is disclosed. A portion of a cross-section of a colored silicon wafer 50 which has a colored top side is shown in FIG. 12. The colored silicon wafer 50 includes a base silicon wafer 502, a first semi-conductor layer 504 and a second semi-conductor layer 506. Similarly, the first semi-conductor layer 504 and the second semi-conductor layer 506 form a photonic crystal layer. Like the second embodiment, there is no protection layer. Similarly, for illustration purpose, the vertical proportion is not to scale (height of the base silicon wafer 502 is much shorter than it is).

The first semi-conductor layer 504 is formed on a portion of a top side of the base silicon wafer 502. The first semi-conductor layer 504 has periodical structures 5042. The difference between the second embodiment and the present embodiment is the periodical structures 5042 have different density. Please see FIG. 12. Density of the periodical structures 5042 is higher in the central portion while the peripherals are lower. The arrangement can make different colors due to the differences of density. As well, the central portion can be replaced with a defect (no structures). The deflect has its own unique reflected color.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A silicon wafer having a colored top side, comprising:
   a wafer, including a plurality of integrated circuit dies, wherein each of the integrated circuit die has a sensing area exposed to light;
   a first layer, formed on a portion of a top side of the wafer, having periodical structures arranged in a two-dimensional array,
   a second layer, formed on the first layer with a bottom side substantially fully contacted with the periodical structures, and
   a protection layer, covering a top portion of the second layer, for providing protection to the second layer, wherein the protection layer is transparent or translucent to pass light beams,
   wherein the first layer and the second layer form a photonic crystal layer and work to reflect from the silicon wafer a predetermined wavelength range of incident visible light beams; and
   wherein the predetermined wavelength range of incident visible light beams reflected from the first layer and second layer is different from those reflected from a top side of the wafer which is not completely covered by the first layer so that at least two different colors are reflected from the silicon wafer and a predetermined image formed by the at least two different colors is shown on the sensing area of each and every integrated circuit die.

2. The silicon wafer according to claim 1, wherein a center distance between adjacent periodical structures ranges from 100 nm to 700 nm.

3. The silicon wafer according to claim 1, wherein the predetermined image displayed by the photonic crystal layer is formed by controlling the predetermined wavelength range of incident visible light beams so that only specified colors can be shown.

4. The silicon wafer according to claim 1, wherein the first layer or the second layer is made of indium tin oxide (ITO), zinc oxide (ZnO), titanium nitride (TiN), titanium (Ti), silver (Ag), aluminum (Al), rhodium (Rh), palladium (Pd), alloy of nickel and aurum (Ni—Au), alloy of titanium and platinum (Ti—Pt), or a mixture thereof.

5. The silicon wafer according to claim 1, wherein the first layer or the second layer is made of silicon (Si), silicon nitride (SiN), silicon dioxide ($SiO_2$), polyimide (PI), silicon carbide (SiC), and silicon oxynitride (SiON).

6. The silicon wafer according to claim 1, further comprising a third layer and a fourth layer, formed from bottom to top in sequence, above at least a portion of the second layer, a portion of the wafer, or a portion of the second layer and the wafer, wherein the third layer and the fourth layer form a photonic crystal layer.

7. The silicon wafer according to claim 6, wherein the third layer has periodical structures and a bottom side of the fourth layer substantially fully contacts the periodical structures.

8. The silicon wafer according to claim 1, wherein the periodical structures are columns, air holes, stacked rods or stacked nano-structures.

9. The silicon wafer according to claim 1, further comprising a plurality of third layers, formed between the first layer and the second layer, each having periodical structures arranged in a two-dimensional array, wherein the periodical structures of the first layer, the second layer and the plurality of third layers together form a three-dimensional array that reflects a predetermined wavelength range of incident visible light beams.

10. A silicon wafer having colored top side, comprising:
a wafer, including a plurality of integrated circuit dies, wherein each of the integrated circuit die has a sensing area exposed to light;
a first layer, formed on at least a portion of a top side of the wafer, having periodical structures arranged in a two-dimensional array,
a second layer, formed on the first layer with a bottom side substantially fully contacted with the periodical structures, and
a protection layer, covering a top portion of the second layer, for providing protection to the second layer, wherein the protection layer is transparent or translucent to pass light beams,
wherein the first layer and the second layer form a photonic crystal layer and work to reflect from the silicon wafer a predetermined wavelength range of incident visible light beams; and
wherein the periodical structures of the first layer include at least two different densities so that at least two different colors are reflected from the silicon wafer and a predetermined image formed by the at least two different colors is shown on the sensing area of each and every integrated circuit die.

11. The silicon wafer according to claim 10, wherein a center distance between adjacent periodical structures ranges from 100 nm to 700 nm.

12. The silicon wafer according to claim 10, wherein the predetermined image displayed by the photonic crystal layer is formed by controlling the predetermined wavelength range of incident visible light beams so that only specified colors can be shown.

13. The silicon wafer according to claim 10, wherein the first layer or the second layer is made of indium tin oxide (ITO), zinc oxide (ZnO), titanium nitride (TiN), titanium (Ti), silver (Ag), aluminum (Al), rhodium (Rh), palladium (Pd), alloy of nickel and aurum (Ni—Au), alloy of titanium and platinum (Ti—Pt), or a mixture thereof.

14. The silicon wafer according to claim 10, wherein the first layer or the second layer is made of silicon (Si), silicon nitride (SiN), silicon dioxide ($SiO_2$), polyimide (PI), silicon carbide (SiC), and silicon oxynitride (SiON).

15. The silicon wafer according to claim 10, further comprising a third layer and a fourth layer, formed from bottom to top in sequence, above at least a portion of the second layer, a portion of the wafer, or a portion of the second layer and the wafer, wherein the third layer and the fourth layer form a photonic crystal layer.

16. The silicon wafer according to claim 15, wherein the third layer has periodical structures and a bottom side of the fourth layer substantially fully contacts the periodical structures.

17. The silicon wafer according to claim 10, wherein the periodical structures are columns, air holes, stacked rods or stacked nano-structures.

18. The silicon wafer according to claim 10, further comprising a plurality of third layers, formed between the first layer and the second layer, each having periodical structures arranged in a two-dimensional array, wherein the periodical structures of the first layer, the second layer and the plurality of third layers together form a three-dimensional array that reflects a predetermined wavelength range of incident visible light beams.

* * * * *